United States Patent
Hong

(10) Patent No.: US 9,209,237 B1
(45) Date of Patent: Dec. 8, 2015

(54) ORGANIC LIGHT-EMITTING DISPLAY DEVICE

(71) Applicant: Samsung Display Co., Ltd., Yongin (KR)

(72) Inventor: Sang Min Hong, Cheonan-si (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/815,163

(22) Filed: Jul. 31, 2015

Related U.S. Application Data

(62) Division of application No. 13/962,085, filed on Aug. 8, 2013, now Pat. No. 9,142,600.

(30) Foreign Application Priority Data

May 20, 2013 (KR) .................. 10-2013-0056601

(51) Int. Cl.
| | | |
|---|---|---|
| H01L 29/08 | (2006.01) |
| H01L 35/24 | (2006.01) |
| H01L 51/00 | (2006.01) |
| H01L 27/32 | (2006.01) |
| H01L 51/52 | (2006.01) |

(52) U.S. Cl.
CPC ........ *H01L 27/3276* (2013.01); *H01L 27/3248* (2013.01); *H01L 27/3262* (2013.01); *H01L 27/3265* (2013.01); *H01L 51/5221* (2013.01)

(58) Field of Classification Search
CPC .............................. H01L 27/00; H01L 51/00
USPC ........................ 257/40, E23.153; 313/498
See application file for complete search history.

(56) References Cited

U.S. PATENT DOCUMENTS

| 7,046,225 | B2 | 5/2006 | Chou |
| 2006/0028407 | A1 | 2/2006 | Chou |
| 2006/0132053 | A1 | 6/2006 | Cho et al. |
| 2007/0115226 | A1 | 5/2007 | Jung et al. |
| 2007/0249110 | A1 | 10/2007 | Choi et al. |
| 2011/0241563 | A1 | 10/2011 | Kim et al. |
| 2013/0176520 | A1 | 7/2013 | Shin et al. |
| 2013/0187135 | A1 | 7/2013 | Yan et al. |

FOREIGN PATENT DOCUMENTS

| KR | 1020060023325 A | 3/2006 |
| KR | 1020080048840 A | 6/2008 |
| KR | 1020110053709 A | 5/2011 |
| KR | 1020120072948 A | 7/2012 |

*Primary Examiner* — Telly Green
(74) *Attorney, Agent, or Firm* — Cantor Colburn LLP

(57) ABSTRACT

An organic light-emitting display device includes a plurality of organic light-emitting diodes which shares a cathode, a plurality of switching elements which is connected to the cathode, a plurality of capacitors, each comprising a first electrode which is connected to each of the switching elements, respectively, and a second electrode and a power bus line which is connected to the second electrode, wherein each of the plurality of switching elements controls a connection between the cathode and the first electrode.

6 Claims, 10 Drawing Sheets

ORGANIC LIGHT-EMITTING DISPLAY DEVICE

This application is a divisional of U.S. patent application Ser. No. 13/962,085, filed on Aug. 8, 2013, which claims priority to Korean Patent Application No. 10-2013-0056601 filed on May 20, 2013, and all the benefits accruing therefrom under 35 U.S.C. §119, the disclosure of which is incorporated herein by reference in its entirety.

BACKGROUND

1. Field

The invention generally relates to an organic light-emitting display device, and more particularly, to an organic light-emitting display device in which a plurality of organic light-emitting diodes share a cathode.

2. Description of the Related Art

As portable display devices such as notebook computers, mobile phones and portable media players ("PMPs") as well as in-home display devices such as televisions ("TVs") and monitors become lighter and thinner, various flat panel display devices are being widely used. A flat panel display device includes a display panel for displaying images. Flat panel display devices may be divided into liquid crystal display devices, organic light-emitting display devices and electrophoretic display devices according to the type of the display panel.

An organic light-emitting display device may include an organic light-emitting diode which includes an anode, a cathode and an organic layer disposed between the anode and the cathode, as a light-emitting element. The organic layer may emit light in response to a signal transmitted to the anode and the cathode. Specifically, the organic layer may emit light at a brightness level corresponding to an electric current flowing therethrough in response to the signal transmitted to the anode and the cathode.

A plurality of organic light-emitting diodes may share a cathode. That is, a plurality of organic light-emitting diodes may share a single layer of conductor as a cathode. All organic light-emitting diodes included in an organic light-emitting display device may share one cathode, and the cathode can be split into several patterns separated from each other.

In an organic light-emitting display device, a cathode may receive power from a region outside a display area in which an image is displayed. When a region of the cathode which corresponds to the region outside the display area is oxidized, internal resistance of the cathode may increase, resulting in a voltage drop of the power supplied to the cathode. Accordingly, luminance stains may be formed on an image displayed on the organic light-emitting display device, thereby degrading display quality of the organic light-emitting display device.

SUMMARY

Exemplary embodiments of the invention provide an organic light-emitting display device which can reduce a voltage drop of power supplied to a cathode.

Exemplary embodiments of the invention also provide an organic light-emitting display device having improved display quality by reducing a voltage drop of power supplied to a cathode.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiments of the invention, there is provided an organic light-emitting display device comprising a plurality of organic light-emitting diodes which shares a cathode, a plurality of switching elements which is connected to the cathode, a plurality of capacitors, each comprising a first electrode which is connected to each of the switching elements, respectively, and a second electrode and a power bus line which is connected to the second electrode, where each of the plurality of switching elements controls a connection between the cathode and the first electrode.

According to another exemplary embodiment of the invention, there is provided an organic light-emitting display device comprising a plurality of organic light-emitting diodes which are arranged in a matrix, where a first row of the matrix shares a first cathode as a cathode and a second row of the matrix shares a second cathode as a cathode, a first switching element which is connected to the first cathode, a second switching element which is connected to the second cathode, a first capacitor which has a first electrode connected to the first switching element, a second capacitor which has a first electrode connected to the second switching element and a power bus line which is connected to a second electrode of the first capacitor and a second electrode of the second capacitor, where the first switching element controls a connection between the first cathode and the first electrode of the first capacitor, and the second switching element controls a connection between the second cathode and the first electrode of the second capacitor.

According to another exemplary embodiment of the invention, there is provided an organic light-emitting display device comprising a plurality of anodes, an organic layer which is disposed on each of the plurality of anodes, a cathode which is disposed on the organic layer, a plurality of thin-film transistors, each having a drain electrode connected to the cathode; and a power bus line which is insulated from a source electrode of each of the plurality of thin-film transistors and overlaps the source electrode of each of the plurality of thin-film transistors to form a capacitor.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
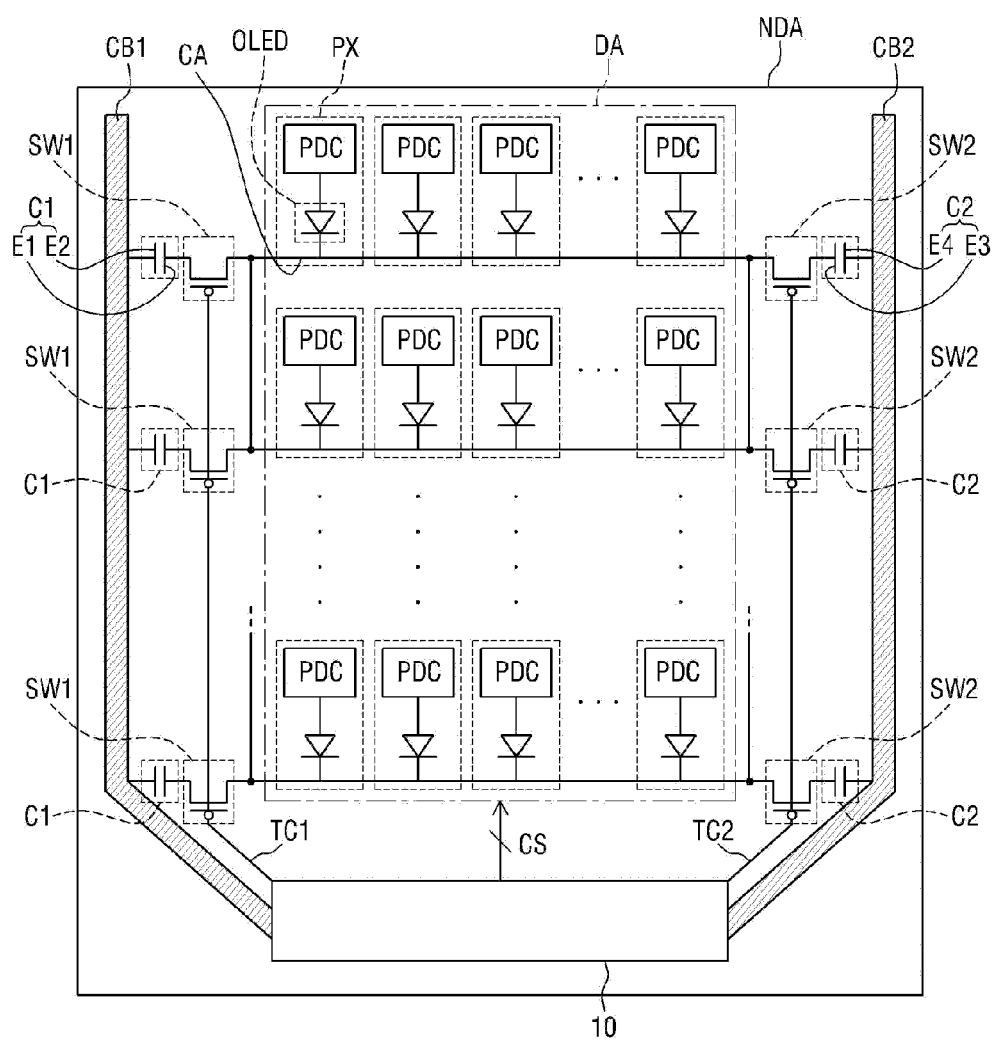
FIG. 1 is a diagram illustrating an organic light-emitting display device according to an exemplary embodiment of the invention.

Advantages and features of the invention and methods of accomplishing the same may be understood more readily by reference to the following detailed description of preferred exemplary embodiments and the accompanying drawings. The invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the invention will only be defined by the appended claims. Thus, in some exemplary embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present.

The terminology used herein is for the purpose of describing particular embodiments only and is not intended to be limiting. As used herein, the singular forms "a," "an," and "the" are intended to include the plural forms, including "at least one," unless the content clearly indicates otherwise. As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that, although the terms first, second, etc., may be used herein to describe various elements, these elements should not be limited by these terms. These terms are only used to distinguish one element from another element. Thus, for example, a first element, a first component or a first section discussed below could be termed a second element, a second component or a second section without departing from the teachings of the invention.

Hereinafter, exemplary embodiments of the invention will be described with reference to the drawings.

FIG. 1 is a diagram illustrating an organic light-emitting display device 100 according to an exemplary embodiment of the invention. Referring to FIG. 1, the organic light-emitting display device 100 includes a plurality of organic light-emitting diodes OLED, a plurality of switching elements (SW1, SW2), a plurality of capacitors (C1, C2), and a plurality of power bus lines (CB1, CB2).

The organic light-emitting diodes OLED may share a cathode CA. In FIG. 1, the cathode CA included in each of the organic light-emitting diodes OLED is connected by one signal line. This indicates that the cathode CA is shared by the organic light-emitting diodes OLED. The cathode CA may be disposed on a whole surface of a display area DA in which an image is displayed.

The organic light-emitting diodes OLED may function as light-emitting elements. Each of a plurality of pixels PX may include at least one organic light-emitting diode OLED. The organic light-emitting diodes OLED may be arranged in a matrix. Accordingly, the pixels PX may also be arranged in a matrix.

The switching elements (SW1, SW2) may be connected to the cathode CA and the capacitors (C1, C2). The switching elements (SW1, SW2) may be connected between the cathode CA and the capacitors (C1, C2). The switching elements (SW1, SW2) may control the connection of the cathode CA and the capacitors (C1, C2). The switching elements (SW1, SW2) may be disposed in a non-display area NDA which surrounds the display area DA and does not display an image.

The switching elements (SW1, SW2) may be simultaneously turned on by power supply signals TC1 and TC2. When the switching elements (SW1, SW2) are simultaneously turned on by the power supply signals TC1 and TC2, voltages charged in the capacitors (C1, C2) via the power bus lines (CB1, CB2) may be transmitted to the cathode CA. Since voltages are applied to the cathode CA via the capacitors (C1, C2), an electric current having direct current (DC) components cannot flow through the cathode CA, although the voltages are applied to the cathode CA. Therefore, the cathode CA does not experience a voltage drop that may occur due to internal resistance increased by oxidation of the cathode CA. Hence, uniform voltages can be applied to the cathode CA, and this can effectively prevent a formation of luminance stains on an image displayed on the organic light-emitting display device 100, thereby improving display quality. In addition, when the switching elements (SW1, SW2) are simultaneously turned on by the power supply signals TC1 and TC2, respectively, uniform voltages may be applied simultaneously to all regions of the cathode CA connected to the switching elements (SW1, SW2). This suppresses a generation of an electric current due to a potential difference between the regions of the cathode CA, which, in turn, effectively prevents a voltage drop caused by internal resistance. The switching elements (SW1, SW2) may be thin-film transistors, the power supply signals TC1 and TC2 may be transmitted to gate electrodes of the thin-film transistors, and the capacitors (C1, C2) and the cathode CA may be connected to source and drain electrodes of the thin-film transistors, respectively.

The switching elements (SW1, SW2) may include first switching elements SW1 and second switching elements SW2. The first switching elements SW1 may be disposed outside and adjacent to a first side of the display area DA, and the second switching elements SW2 may be disposed outside and adjacent to a second side of the display area DA. The first and second sides of the display area DA may be opposite to each other. The first switching elements SW1 may be connected to the cathode CA in regions adjacent to the first side of the display area DA, and the second switching elements SW2 may be connected to the cathode CA in regions adjacent to the second side of the display area DA. Therefore, the switching elements (SW1, SW2) may apply voltages to both sides of the cathode CA, and this can ensure uniform voltage levels across the whole surface of the cathode CA.

Each of the capacitors (C1, C2) may include a first electrode E1 or E3 and a second electrode E2 or E4. The first electrodes E1 and E3 may be connected to the switching elements (SW1, SW2), respectively. The second electrodes E2 and E4 may be connected to the power bus lines (CB1, CB2), respectively. When the switching elements (SW1, SW2) are turned off, the capacitors (C1, C2) may be charged with voltages applied to the power bus lines (CB1, CB2). When the switching elements (SW1, SW2) are turned on, the charged voltages may be transmitted to the cathode CA. The capacitors (C1, C2) may include first capacitors C1 and second capacitors C2. The first capacitors C1 may be disposed outside and adjacent to the first side of the display area DA, and the second capacitors C2 may be disposed outside and adjacent to the second side of the display area DA. The first capacitors C1 may be connected to the first switching elements SW1. Specifically, the first electrodes E1 of the first capacitors C1 may be connected to the first switching elements SW1. The second capacitors C2 may be connected to the second switching elements SW2. More specifically, the first electrodes E3 of the second capacitors C2 may be connected to the second switching elements SW2.

The power bus lines (CB1, CB2) may apply voltages to the second electrodes E2 and E4 of the capacitors (C1, C2), respectively. A first power supply voltage ELVSS which will be described later may be applied to the power bus lines (CB1, CB2) and may be delivered to the cathode CA via the capacitors (C1, C2) and the switching elements (SW1, SW2). The power bus lines (CB1, CB2) may receive the first power supply voltage ELVSS from a driving unit 10 which will be described later. The power bus lines (CB1, CB2) may be relatively wider than other wiring lines in order to effectively prevent a voltage drop. The power bus lines (CB1, CB2) may include a first power bus line CB1 and a second power bus line CB2. The first power bus line CB1 may be disposed outside and adjacent to the first side of the display area DA, and the second power bus line CB2 may be disposed outside and adjacent to the second side of the display area DA. The first power bus line CB1 may be connected to the second electrodes E2 of the first capacitors C1, and the second power bus line CB2 may be connected to the second electrodes E4 of the second capacitors C2.

The organic light-emitting display device 100 may further include the driving unit 10. The driving unit 10 may provide the first power supply voltage ELVSS to the power bus lines (CB1, CB2). The driving unit 10 may generate the power supply signals TC1 and TC2 and perform ON/OFF control of the switching elements (SW1, SW2) using the power supply signals TC1 and TC2. The driving unit 10 may transmit a control signal CS for driving the pixels PX to pixel control circuits PDC which will be described later. The driving unit 10 will hereinafter be described in more detail with reference to FIG. 2.

Figure 2:
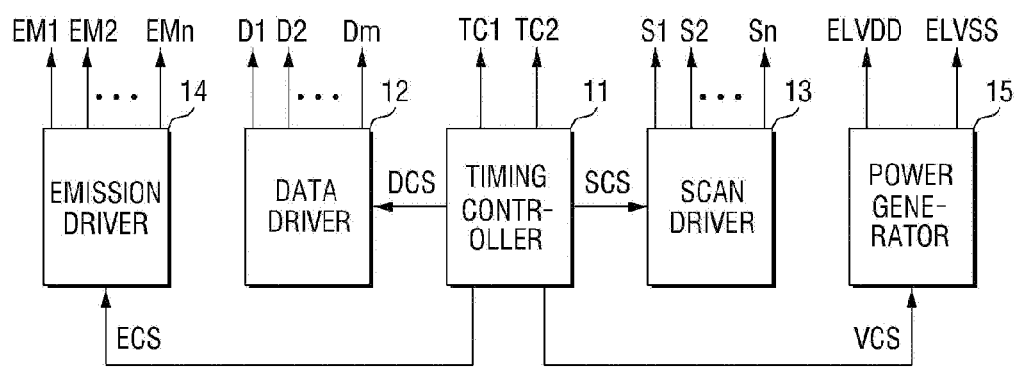
FIG. 2 is a block diagram of a driving unit according to an exemplary embodiment of the invention.

FIG. 2 is a block diagram of the driving unit 10 according to an exemplary embodiment of the invention. Referring to FIG. 2, the driving unit 10 may include a timing controller 11, a data driver 12, a scan driver 13, an emission driver 14, and a power generator 15.

The timing controller 11 may receive image data from an external source and generate a scan driver control signal SCS, a data driver control signal DCS, an emission driver control signal ECS and a power generator control signal VCS corresponding to the image data. The timing controller 11 may generate the power supply signals TC1 and TC2 and perform ON/OFF control of the switching elements (SW1, SW2) using the power supply signals TC1 and TC2.

The data driver 12 may receive the data driver control signal DCS and generate first through $m^{th}$ data signals D1 through Dm corresponding to the data driver control signal DCS. The first through $m^{th}$ data signals D1 through Dm may be transmitted to the pixels PX. One of the first through $m^{th}$ data signals D1 through Dm may be transmitted to a plurality of pixels PX included in the same column from among the pixels PX. The first through $m^{th}$ data signals D1 through Dm may correspond to luminance levels of light emitted from the organic light-emitting diodes OLED included in the pixels PX.

The scan driver 13 may receive the scan driver control signal SCS and generate first through $n^{th}$ scan signals S1 through Sn corresponding to the scan driver control signal SCS. Each of the first through $n^{th}$ scan signals S1 through Sn generated by the scan driver 13 may have an electric potential of a scan-on voltage or a scan-off voltage. The first through $n^{th}$ scan signals S1 through Sn may sequentially have the electric potential of the scan-on voltage. When the first through $n^{th}$ scan signals S1 through Sn have the electric potential of the scan-on voltage, the first through $m^{th}$ data signals D1 through Dm may be transmitted to the pixels PX. The first through $n^{th}$ scan signals S1 through Sn may be generated in synchronization with the first through $m^{th}$ data signals D1 through Dm. One of the first through $n^{th}$ scan signals S1 through Sn may be transmitted to a plurality of pixels PX included in the same row.

The emission driver 14 may receive the emission driver control signal ECS and generate the first through $n^{th}$ emission signals EM1 through EMn corresponding to the emission driver control signal ECS. Each of the first through $n^{th}$ emission signals EM1 through EMn may have an electric potential of an emission-on voltage or an emission-off voltage. Organic light-emitting diodes OLED included in pixels PX which receive the first through $n^{th}$ emission signals EM1 through EMn having the electric potential of the emission-on voltage may emit light. After an electric potential of an $i^{th}$ scan signal Si changes from the scan-on voltage to the scan-off voltage, an electric potential of an $i^{th}$ emission signal EM(i) may change from the emission-off voltage to the emission-on voltage, where i is a natural number from 1 to n.

The power generator 15 may generate the first power supply voltage ELVSS and a second power supply voltage ELVDD and may be controlled by the power generator control signal VCS.

Referring back to FIG. 1, the organic light-emitting display device 100 may further include a plurality of pixel driving circuits PDC. The pixel driving circuits PDC may respectively be included in the pixels PX and control light emission of the organic light-emitting diodes OLED. The operation of the pixel driving circuits PDC will hereinafter be described in more detail with reference to FIG. 3.

Figure 3:
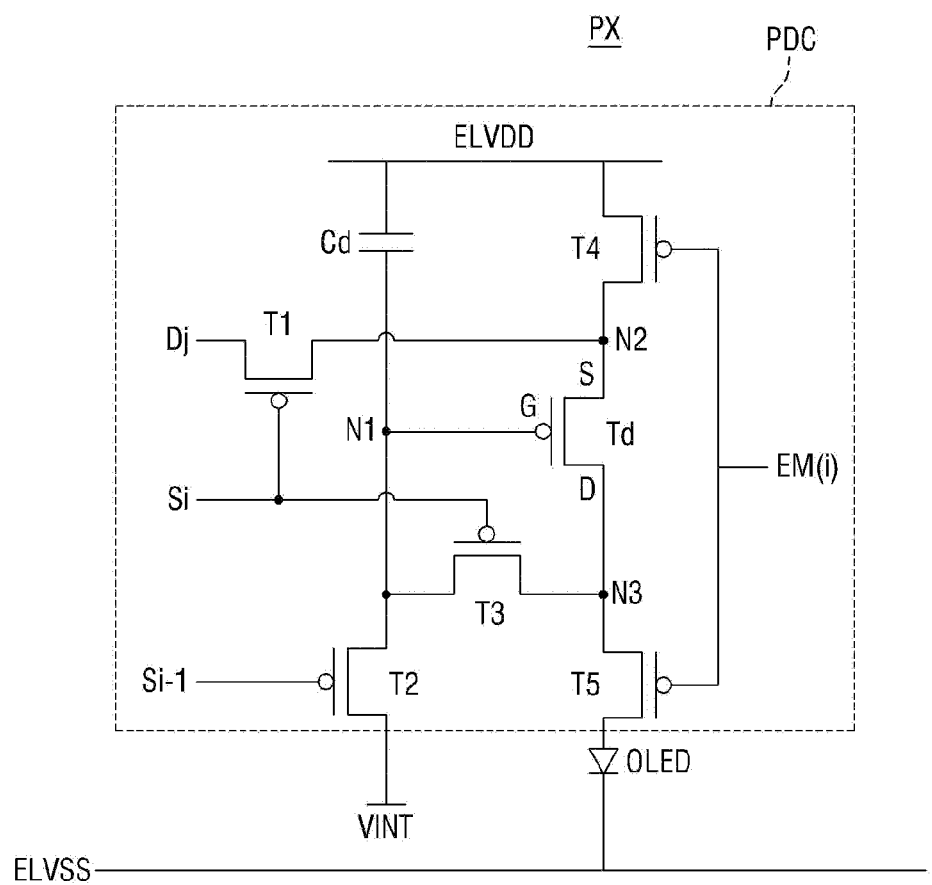
FIG. 3 is a circuit diagram of a pixel according to an exemplary embodiment of the invention.

FIG. 3 is a circuit diagram of a pixel PX according to an exemplary embodiment of the invention. Referring to FIG. 3, the pixel PX may include a pixel driving circuit PDC and an organic light-emitting diode OLED. The pixel driving circuit PDC may include a data control transistor T1, an initialization transistor T2, a threshold voltage compensation transistor T3, a first emission control transistor T4, a second emission control transistor T5, a driving transistor Td, the organic light-emitting diode OLED, and a driving capacitor Cd.

The organic light-emitting diode OLED may emit light at a luminance level corresponding to a magnitude of an electric current which flows in a direction from an anode of the organic light-emitting diode OLED to a cathode of the organic light-emitting diode OLED. The first power supply voltage ELVSS may be applied to the cathode of the organic light-emitting diode OLED. The anode of the organic light-emitting diode OLED may be connected to a third node N3, and the second emission control transistor T5 may control connection of the anode of the organic light-emitting diode OLED to the third node N3.

The driving transistor Td may include a source S connected to a second node N2 to which the second power supply voltage ELVDD is applied, a drain D connected to the third node N3 and a gate G connected to a first node N1. The driving transistor Td may receive a $j^{th}$ data signal Dj through the data control transistor T1 connected to the second node N2, where j is a natural number from 1 to m. The driving transistor Td may control an electric current flowing through the organic light-emitting diode OLED. The magnitude of the electric current flowing through the organic light-emitting diode OLED may correspond to a potential difference between the source S and the gate G of the driving transistor Td.

The data control transistor T1 may include a source provided with the jth data signal Dj, a drain connected to the second node N2, and a gate provided with the ith scan signal Si. When the ith scan signal Si has an electric potential of the scan-on voltage, the data control transistor T1 may be turned on to provide the jth data signal Dj to the second node N2.

A first terminal of the driving capacitor Cd may be connected to the first node N1 which is connected to the gate G of the driving transistor Td, and the second power supply voltage ELVDD may be applied to a second terminal of the driving capacitor Cd. Therefore, the driving capacitor Cd may store a voltage of the gate G of the driving transistor Td.

The ith scan signal Si may be transmitted to a gate of the threshold voltage compensation transistor T3. When the ith scan signal Si has the electric potential of the scan-on voltage, the threshold voltage compensation transistor T3 is turned on. The threshold voltage compensation transistor T3 may connect the gate G and the drain D of the driving transistor Td, thereby diode-connecting the driving transistor Td. When the driving transistor Td is diode-connected, a voltage, to which a voltage of the jth data signal Dj transmitted to the source S of the driving transistor Td was dropped by a threshold voltage of the driving transistor Td, is applied to the gate G of the driving transistor Td. Since the gate G of the driving transistor Td is connected to the first terminal of the driving capacitor Cd, the voltage applied to the gate G of the driving transistor Td may be maintained. Since the voltage which reflects the threshold voltage of the driving transistor Td is applied to the gate G of the driving transistor Td and maintained accordingly, an electric current flowing between the source S and the drain D of the driving transistor Td may not be affected by the threshold voltage of the driving transistor Td.

An (i−1)th scan signal Si-1 may be transmitted to a gate of the initialization transistor T2. When the (i−1)th scan signal Si-1 has the electric potential of the scan-on voltage, the initialization transistor T2 is turned on to provide an initialization voltage VINT to the gate G of the driving transistor Td. Accordingly, an electric potential of the gate G of the driving transistor Td may be initialized.

The $i^{th}$ emission control signal EM(i) may be transmitted to a gate electrode of the first emission control transistor T4. When the $i^{th}$ emission control signal EM(i) has an electric potential of the emission-on voltage, the first emission control transistor T4 may be turned on to provide the second power supply voltage ELVDD to the second node N2. The $i^{th}$ emission control signal EM(i) may be transmitted to a gate electrode of the second emission control transistor T5. When the $i^{th}$ emission control signal EM(i) has the electric potential of the emission-on voltage, the second emission control transistor T5 may be turned on to connect the third node N3 and the anode of the organic light-emitting diode OLED. When the $i^{th}$ emission control signal EM(i) has the electric potential of the emission-on voltage, if the first emission control transistor T4 and the second emission control transistor T5 are turned on, an electric current corresponding to the voltage of the $j^{th}$ data signal Dj stored in the driving capacitor Cd is generated between the source S and the drain D of the driving transistor Td for a period of time during which the $i^{th}$ scan signal Si has the electric potential of the scan-on voltage. The electric current may flow to the organic light-emitting diode OLED, thus causing the organic light-emitting diode OLED to emit light.

Figure 4:
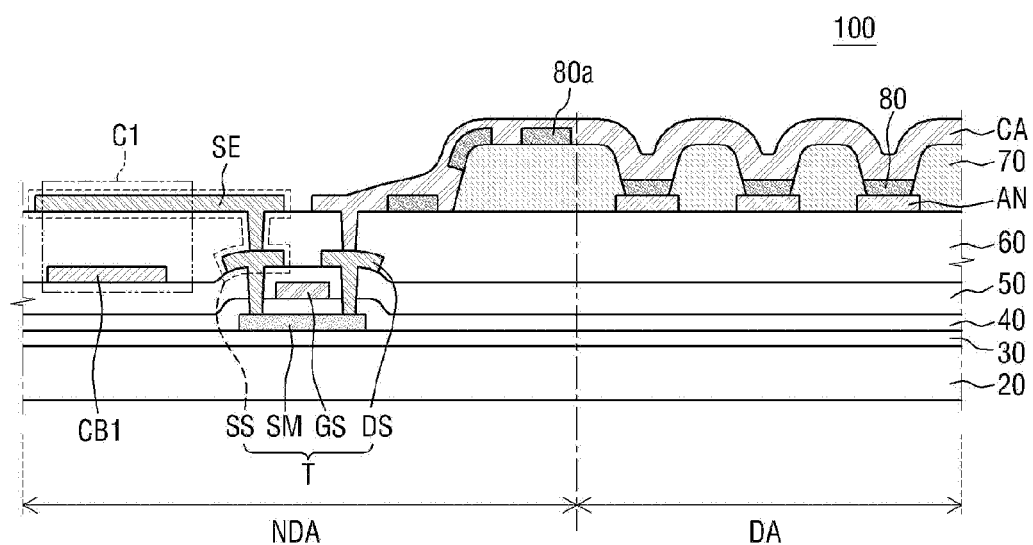
FIG. 4 is a cross-sectional view of the organic light-emitting display device shown in FIG. 1.

The organic light-emitting display device 100 will hereinafter be described in more detail with reference to FIG. 4. FIG. 4 is a cross-sectional view of the organic light-emitting display device 100 shown in FIG. 1. Referring to FIG. 4, the organic light-emitting display device 100 may include a substrate 20, a buffer layer 30, a gate insulating layer 40, an interlayer insulating film 50, a planarization layer 60, a semiconductor layer SM, a gate electrode GS, a source electrode SS, a drain electrode DS, a pixel defining layer 70, a plurality of anodes AN, a plurality of organic layers 80, a plurality of dummy organic layers 80a, the cathode CA and the first power bus line CB1.

The substrate 20 may be plate-shaped and support other structures formed thereon. In one exemplary embodiment, the substrate 20 may include an insulating material. The substrate 20 may include, but not limited to, glass, polyethylene terephthalate (PET), polycarbonate (PC), polyethersulfone (PES), polyimide (PI) or polymethyl methacrylate (PMMA), for example. According to other exemplary embodiments, the substrate 20 may include a flexible material.

The buffer layer 30 may be formed on a top surface of the substrate 20. The buffer layer 30 may effectively prevent penetration of impurity elements from the substrate 20 thereunder and may planarize the top surface of the substrate 20.

The buffer layer 30 may include various materials that can perform these functions. The buffer layer 30 may include any one of a silicon nitride ($SiN_x$) layer, a silicon oxide ($SiO_2$) layer, and a silicon oxynitride ($SiO_xN_y$) layer, for example. According to some exemplary embodiments, the buffer layer 30 may be omitted.

The semiconductor layer SM may be disposed on the buffer layer 30. The semiconductor layer SM may include an amorphous silicon layer or a polycrystalline silicon layer. The semiconductor layer SM may include a channel region undoped with impurities and a source region and a drain region which are disposed on both sides of the channel region and are p+-doped to contact the source electrode SS and the drain electrode DS, respectively. In one exemplary embodiment, impurities used to dope the semiconductor layer SM may be P-type impurities including boron (B) such as $B_2H_6$. However, the type of impurities used to dope the semiconductor layer SM may vary according to exemplary embodiments. In some exemplary embodiments, the semiconductor layer SM may be replaced by an oxide semiconductor layer.

The gate insulating layer 40 may be disposed on the semiconductor layer SM. The gate insulating layer 40 may insulate the gate electrode GS and the semiconductor layer SM from each other. The gate insulating layer 40 may include silicon nitride ($SiN_x$) or silicon oxide ($SiO_2$).

The gate electrode GS may be disposed on the gate insulating layer 40. The gate electrode GS may overlap at least a region of the semiconductor layer SM. A voltage applied to the gate electrode GS may control the semiconductor layer SM to have conductivity or non-conductivity. When a relatively high voltage is applied to the gate electrode GS, for example, the semiconductor layer SM may have conductivity, thereby electrically connecting the drain electrode DS and the source electrode SS to each other. When a relatively low voltage is applied to the gate electrode GS, the semiconductor layer SM may have non-conductivity, thereby insulating the drain electrode DS and the source electrode SS from each other.

The interlayer insulating film 50 may be disposed on the gate electrode GS. The interlayer insulating film 50 may cover the gate electrode GS so as to insulate the gate electrode GS from the source electrode SS and the drain electrode DS. The interlayer insulating film 50 may include silicon nitride ($SiN_x$) or silicon oxide ($SiO_2$).

The source electrode SS and the drain electrode DS may be disposed on the interlayer insulating film 50. The source electrode SS and the drain electrode DS may be connected to the semiconductor layer SM respectively by contact holes that penetrate through the interlayer insulating film 50 and the gate insulating layer 40. The source electrode SS, the drain electrode DS, the gate electrode GS, and the semiconductor layer SM may form a thin-film transistor T, and the thin-film transistor T may function as a switching element (SW1, SW2).

Figure 5:
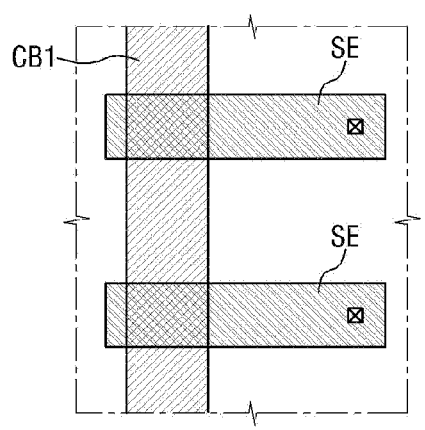
FIG. 5 is a plan view illustrating a first power bus line and a source electrode according to an exemplary embodiment of the invention.

The source electrode SS will hereinafter be described in more detail with reference to FIG. 5. FIG. 5 is a plan view illustrating the first power bus line CB1 and an extended source electrode portion SE according to an exemplary embodiment of the invention. Referring to FIGS. 4 and 5, the source electrode SS may include an extended source electrode portion SE which extends toward the first power bus line CB1. The extended source electrode portion SE may overlap the first power bus line CB1. The extended source electrode portion SE and the first power bus line CB1 may overlap each other to form a first capacitor C1. The extended source electrode portion SE may be disposed on the planarization layer 60 and the first power bus line CB1.

Referring back to FIG. 4, the planarization layer 60 may be disposed on the thin-film transistor T and the interlayer insulating film 50. In order to improve emission efficiency of the organic layers 80 disposed on the planarization layer 60, the planarization layer 60 may be formed to have a flat top surface without a step. In one exemplary embodiment, the planarization layer 60 may include an insulating material. The planarization layer 60 may include one or more materials selected from, but not limited to, polyacrylates resin, epoxy resin, phenolic resin, polyamides resin, polyimides rein, unsaturated polyesters resin, poly phenylenethers resin, poly phenylenesulfides resin and benzocyclobutene (BCB), for example.

The anodes AN may be disposed on the planarization layer 60. The anodes AN may be disposed in the pixels PX, respectively. The arrangement of the anodes AN may be substantially the same as the arrangement of the pixels PX. Since the pixels PX may be arranged in a matrix, the anodes AN may also be arranged in a matrix. The anodes AN may function as anodes of the organic light-emitting diodes OLED. In one exemplary embodiment, the anodes AN may include a reflective conductive material. The anodes AN may have, but not limited to, an Ag/indium tin oxide (ITO), ITO/Ag/ITO, Mo/ITO, Al/ITO or Ti/ITO structure, for example. The anodes AN including the reflective conductive material may reflect light generated by the organic layers 80.

The organic layers 80 may be disposed on the anodes AN. Each of the organic layers 80 may emit light at a brightness level corresponding to an electric current flowing therethrough. In one exemplary embodiment, each of the organic layers 80 disposed on the anodes AN may emit red, green or blue light. However, the invention is not limited thereto, and all of the organic layers 80 disposed on the anodes AN may also emit white light.

The cathode CA may be disposed on the organic layers 80. The cathode CA may be formed as a common layer in the pixels PX. The anodes AN, the organic layers 80 and the cathode CA may form the organic light-emitting diodes OLED, and the organic light-emitting diodes OLED may share the cathode CA formed as a common layer. In one exemplary embodiment, the cathode CA may include an optically transparent or semi-transparent conductive material. The cathode CA may include, but not limited to, ITO, indium zinc oxide (IZO), a compound of magnesium (Mg) and silver (Ag), a compound of calcium (Ca) and Ag, or a compound of lithium (Li) and aluminum (Al), for example. Light generated by the organic layers 80 may pass through the cathode CA to be emitted to an outside of the organic light-emitting display device 100.

The cathode CA may extend up to the non-display area NDA. The cathode CA may be connected to the drain electrode DS. The cathode CA may be connected to the drain electrode DS by a contact hole defined in the planarization layer 60. When the thin-film transistor T is turned on, a voltage charged in the first capacitor C1 may be delivered to the cathode CA through the drain electrode DS. Since a voltage is applied to the cathode CA via the first capacitor C1, DC components of an electric current flowing through the cathode CA can be blocked, compared with when a voltage is applied directly to the cathode CA. Therefore, even when internal resistance is increased by oxidation of the cathode CA, a resulting voltage drop can be reduced.

The pixel defining layer 70 may be disposed on the planarization layer 60. The pixel defining layer 70 may define regions of the pixels PX. A plurality of openings exposing top surfaces of the anodes AN may be defined in the pixel defining layer 70, and regions within the openings may be defined as the pixels PX, respectively.

The first power bus line CB1 may be disposed under the source electrode SS. Specifically, the first power bus line CB1 may be disposed under the extended source electrode portion SE. In one exemplary embodiment, the first power bus line CB1 may be disposed between the planarization layer 60 and the interlayer insulating film 50. However, the position of the first power bus line CB1 is not limited to the above position.

The dummy organic layers 80a may be disposed in the non-display area NDA to contact a bottom surface of the cathode CA. In order to effectively prevent deformation of opening patterns formed in a mask used to form the organic layers 80, dummy opening patterns may be formed around the opening patterns. The dummy organic layers 80a may include an organic material deposited through the dummy opening patterns when the organic layers 80 are formed using the mask. The dummy organic layers 80a may increase the internal resistance of the cathode CA by promoting oxidation of the cathode CA. However, even when the internal resistance of the cathode CA is increased by the promotion of the oxidation of the cathode CA using the dummy organic layers 80a, a voltage drop due to the increased internal resistance of the cathode CA can be effectively prevented because a voltage is applied to the cathode CA via the first capacitor C1. Consequently, this reduces luminance stains of the organic light-emitting display device 100 and improves display quality of the organic light-emitting display device 100.

Although not shown in FIGS. 4 and 5, a description of the second power bus line CB2 and a second capacitor C2 is substantially the same as the description of the first power bus line CB1 and the first capacitor C1.

Figure 6:
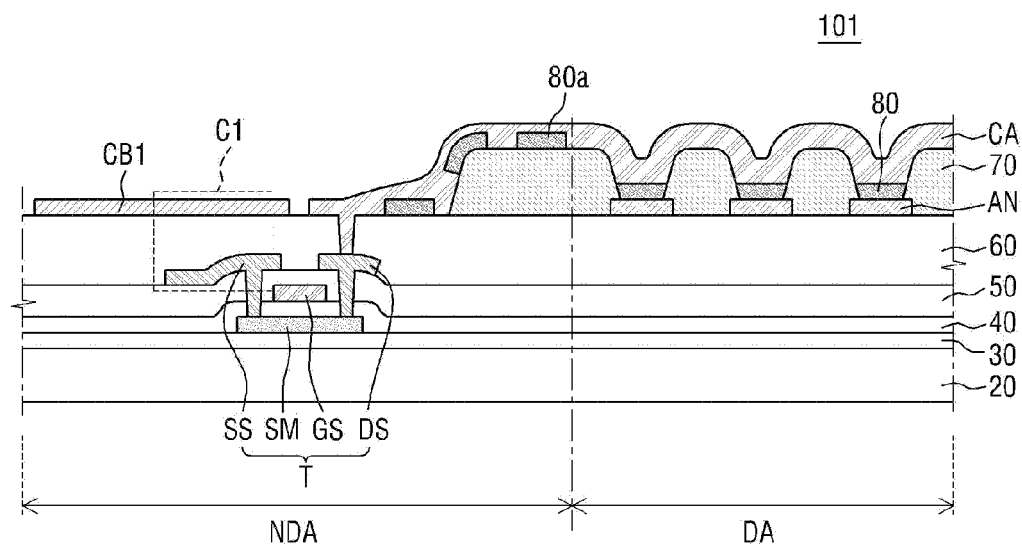
FIG. 6 is a cross-sectional view of an organic light-emitting display device according to another exemplary embodiment of the invention.
Figure 7:
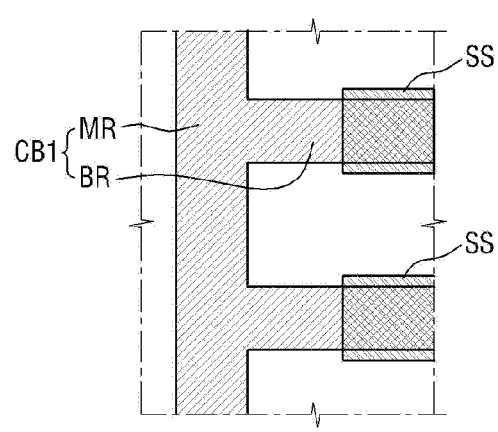
FIG. 7 is a plan view illustrating a first power bus line and a source electrode according to another exemplary embodiment of the invention.

Another exemplary embodiment of the invention will hereinafter be described with reference to FIGS. 6 and 7. FIG. 6 is a cross-sectional view of an organic light-emitting display device 101 according to another exemplary embodiment of the invention. FIG. 7 is a plan view illustrating a first power bus line CB1 and a source electrode SS according to another exemplary embodiment of the invention. Referring to FIGS. 6 and 7, the first power bus line CB1 may extend toward the source electrode SS to overlap the source electrode SS. The first power bus line CB1 may overlap the source electrode SS to form a first capacitor C1. The first power bus line CB1 may be disposed above the source electrode SS. Specifically, the first power bus line CB1 may be disposed on a planarization layer 60. The first power bus line CB1 may include a main region MR and sub-regions BR. The main region MR may extend along a side of a display area DA. The sub-regions BR may protrude from the main region MR toward the display area DA. Each of the sub-regions BR may extend onto the source electrode SS to overlap the source electrode SS.

Although not shown in FIGS. 6 and 7, a description of a second power bus line CB2 and a second capacitor C2 is substantially the same as the description of the first power bus line CB1 and the first capacitor C1 in the illustrated exemplary embodiment of the invention.

Figure 8:
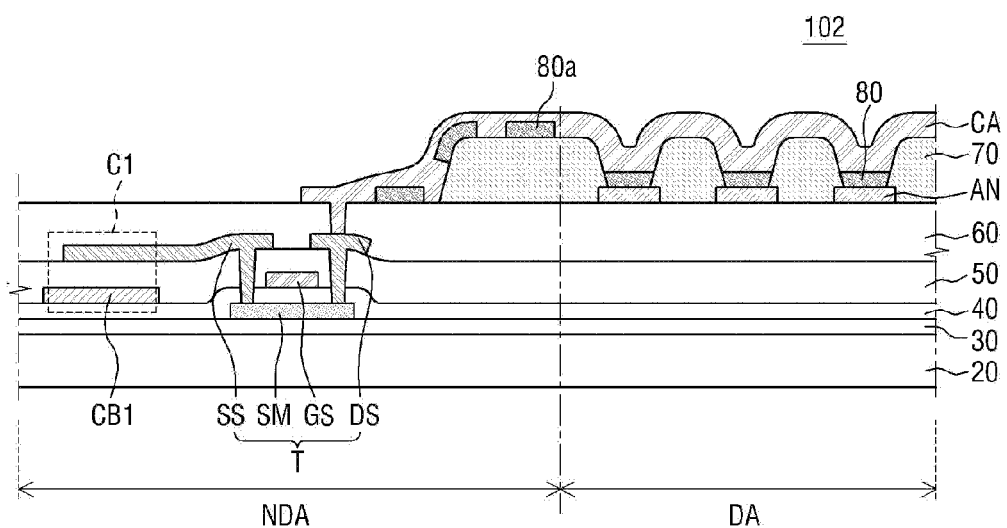
FIG. 8 is a cross-sectional view of an organic light-emitting display device according to another exemplary embodiment of the invention.
Figure 9:
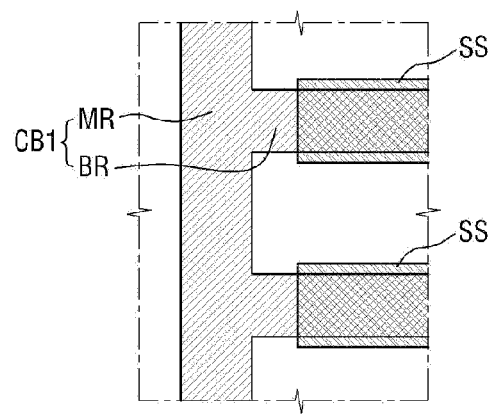
FIG. 9 is a plan view illustrating a first power bus line and a source electrode according to another exemplary embodiment of the invention.

Another exemplary embodiment of the invention will hereinafter be described with reference to FIGS. 8 and 9. FIG. 8 is a cross-sectional view of an organic light-emitting display device 102 according to another exemplary embodiment of the invention. FIG. 9 is a plan view illustrating a first power bus line CB1 and a source electrode SS according to another exemplary embodiment of the invention. Referring to FIGS. 8 and 9, the first power bus line CB1 may be disposed under the source electrode SS. More specifically, the first power bus line CB1 may be disposed between an interlayer insulating film 50 and a gate insulating layer 40. However, the position of the first power bus line CB1 is not limited to the above position. The first power bus line CB1 and the source electrode SS may overlap each other to form a first capacitor C1. The source electrode SS may extend toward the first power bus line CB1. The first power bus line CB1 may extend toward the source electrode SS. The first power bus line CB1 may include a main region MR and sub-regions BR, each of sub-regions BR protruding from the main region MR toward the source electrode SS. Since the source electrode SS and the first power bus line CB1 extend toward each other, an overlap area between them may increase, thus increasing the capacitance of the first capacitor C1.

Although not shown in FIGS. 8 and 9, a description of a second power bus line CB2 and a second capacitor C2 is substantially the same as the description of the first power bus line CB1 and the first capacitor C1 in the illustrated exemplary embodiment of the invention.

Figure 10:
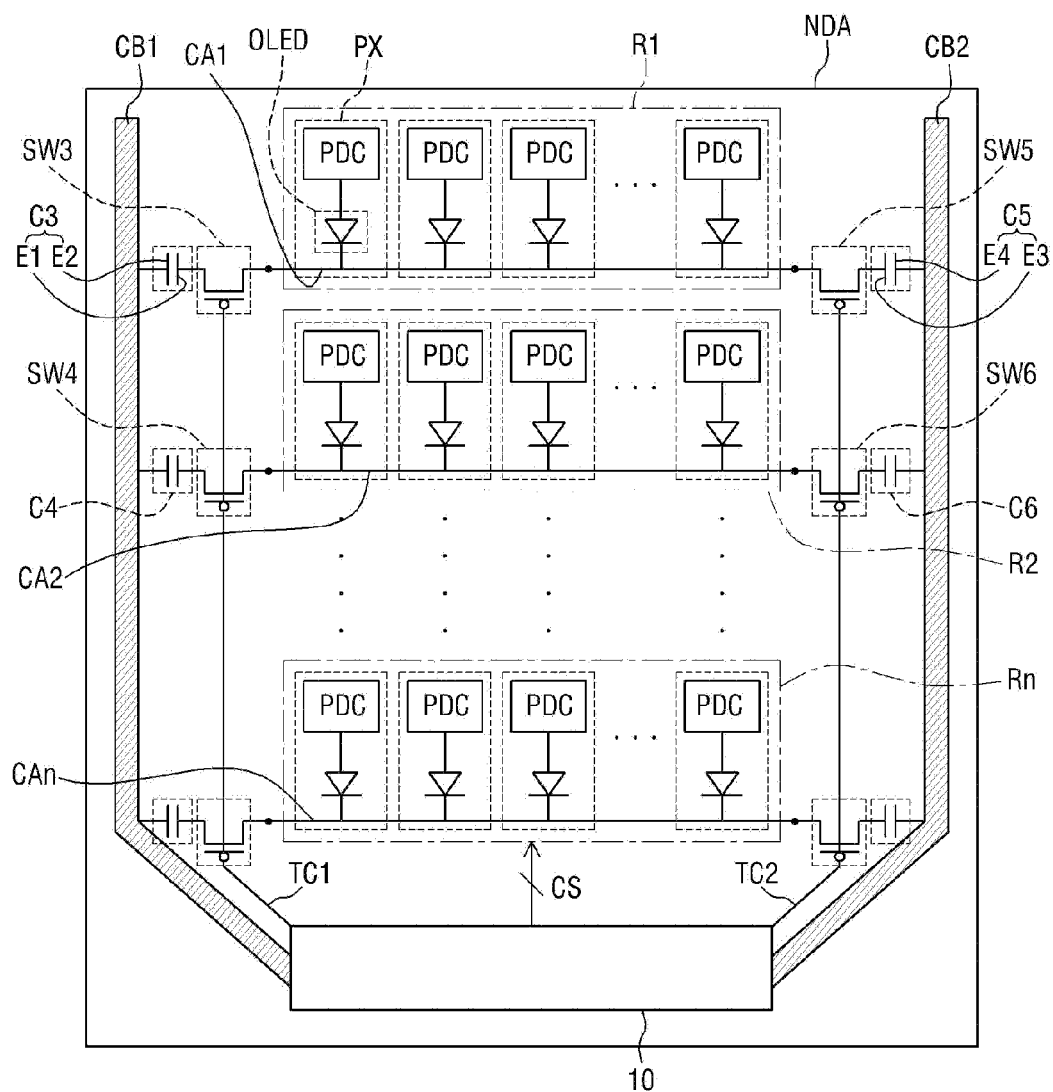
FIG. 10 is a diagram illustrating an organic light-emitting display device according to another exemplary embodiment of the invention.
Figure 11:
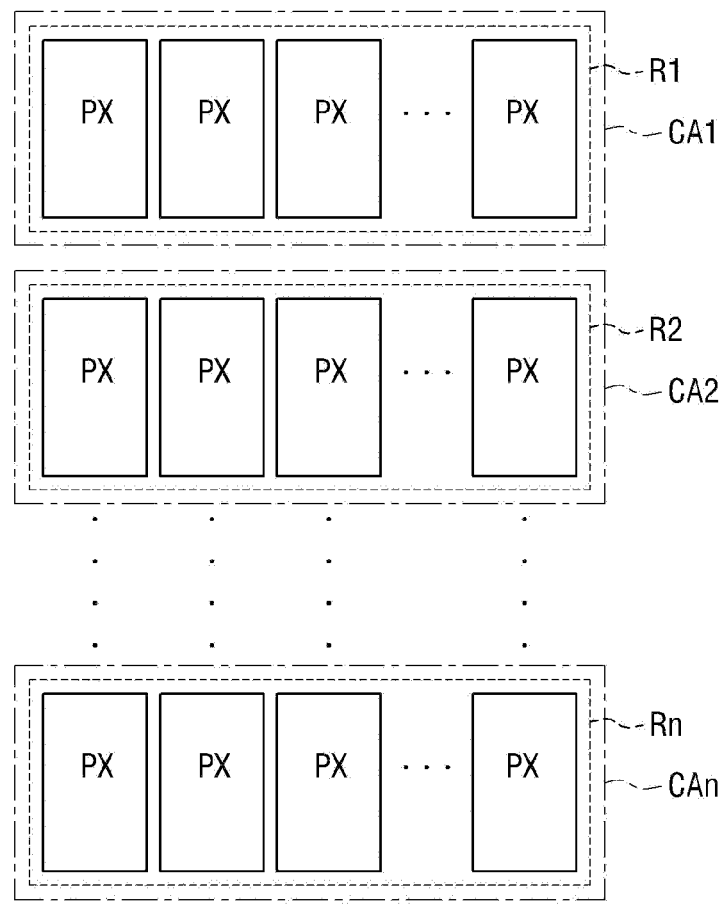
FIG. 11 is a diagram illustrating the arrangement of first through nth cathodes according to another exemplary embodiment of the invention.

Another exemplary embodiment of the invention will hereinafter be described with reference to FIGS. 10 and 11. FIG. 10 is a diagram illustrating an organic light-emitting display device 103 according to another exemplary embodiment of the invention. FIG. 11 is a diagram illustrating the arrangement of first through $n^{th}$ cathodes CA1 through CAn according to another exemplary embodiment of the invention. Referring to FIGS. 10 and 11, the cathode CA of FIG. 1 may be split into the first through nth cathodes CA1 through CAn. Each of the first through nth cathodes CA1 through CAn may extend in a row direction. An end of each of the first through nth cathodes CA1 through CAn may extend to outside and adjacent to a first side of a display area DA, and the other end thereof may extend to outside and adjacent to a second side of the display area DA. Each of the first through nth cathodes CA1 through CAn may be formed as a common layer in one of first through $n^{th}$ rows R1 through Rn of a plurality of pixels PX arranged in a matrix. The first cathode CA1 may be formed as a common layer in the first row R of the pixels PX, and the second cathode CA2 may be formed as a common layer in the second row R2 of the pixels PX, for example. Each row of a plurality of organic light-emitting diodes OLED arranged in a matrix may share one of the first through $n^{th}$ cathodes CA1 through CAn as a cathode.

One or more switching elements may be connected to each of the first through $n^{th}$ cathodes CA1 through CAn. A third switching element SW3 may be connected to the first cathode CAL and a fourth switching element SW4 may be connected to the second cathode CA2, for example. The third switching element SW3 and the fourth switching element SW4 may be disposed outside and adjacent to the first side of the display area DA. A third capacitor C3 may be connected to the third switching element SW3, and a fourth capacitor C4 may be connected to the fourth switching element SW4. The third switching element SW3 may control connection of the third capacitor C3 to the first cathode CA1. The fourth switching element SW4 may control connection of the fourth capacitor C4 to the second cathode CA2.

Each of the third capacitor C3 and the fourth capacitor C4 may be connected between the third or fourth switching element SW3 or SW4 and a first power bus line CB1. When the third switching element SW3 is tuned on, a voltage may be applied to the first cathode CA1 by electric charges charged in the third capacitor C3. When the fourth switching element SW4 is turned on, a voltage may be applied to the second cathode CA2 by electric charges charged in the fourth capacitor C4.

Each of the first through $n^{th}$ cathodes CA1 through CAn may also receive a voltage from a switching element and a capacitor located in a region adjacent to the second side of the display area DA. A fifth switching element SW5 may be connected to the first cathode CA1 and a sixth switching element SW6 may be connected to the second cathode CA2, for example. The fifth switching element SW5 and the sixth switching element SW6 may be disposed outside and adjacent to the second side of the display area DA. A fifth capacitor C5 may be connected to the fifth switching element SW5, and a sixth capacitor C6 may be connected to the sixth switching element SW6. The fifth switching element SW5 may control connection of the fifth capacitor C5 to the first cathode CA1. The sixth switching element SW6 may control connection of the sixth capacitor C6 to the second cathode CA2.

Each of the fifth capacitor C5 and the sixth capacitor C6 may be connected between the fifth or sixth switching element SW5 or SW6 and a second power bus line CB2. The fifth switching element SW5 and the sixth switching element SW6 may be turned on at the same time as the third switching element SW3 and the fourth switching element SW4 are turned on to deliver voltages formed by electric charges charged in the fifth capacitor C5 and the sixth capacitor C6 to the first cathode CA1 and the second cathode CA2, respectively.

A description of the third through $n^{th}$ cathodes CA3 through CAn is substantially the same as the description of the first cathode CA1 and the second cathode CA2.

A cross-sectional view of the organic light-emitting display device 103 may be substantially the same as the cross-sectional view of FIGS. 4, 6 and 8.

Other elements of the organic light-emitting display device 103 are substantially the same as those of the organic light-emitting display device 100 of FIG. 1 indicated by like reference numerals, and thus a description thereof will be omitted.

Figure 12:
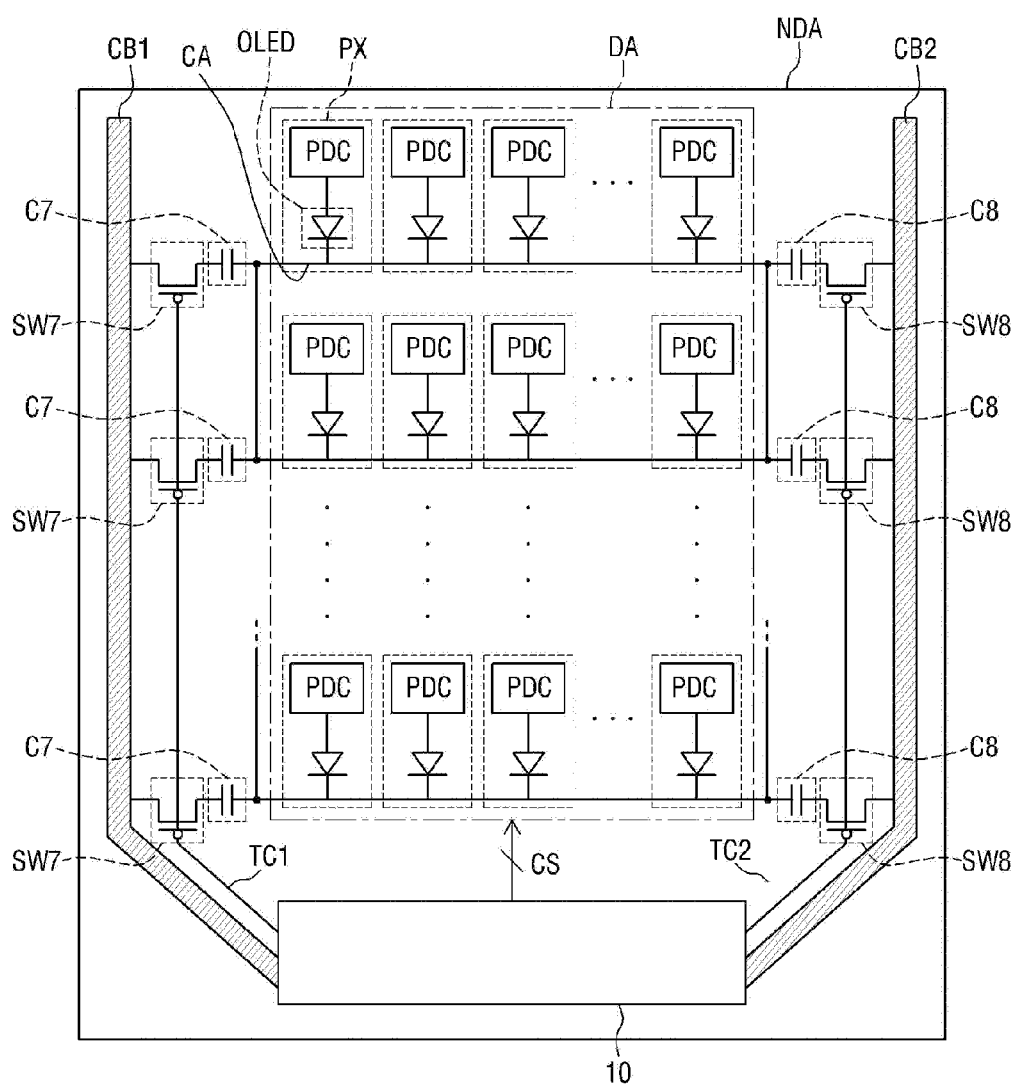
FIG. 12 is a diagram illustrating an organic light-emitting display device according to another exemplary embodiment of the invention.
Figure 13:
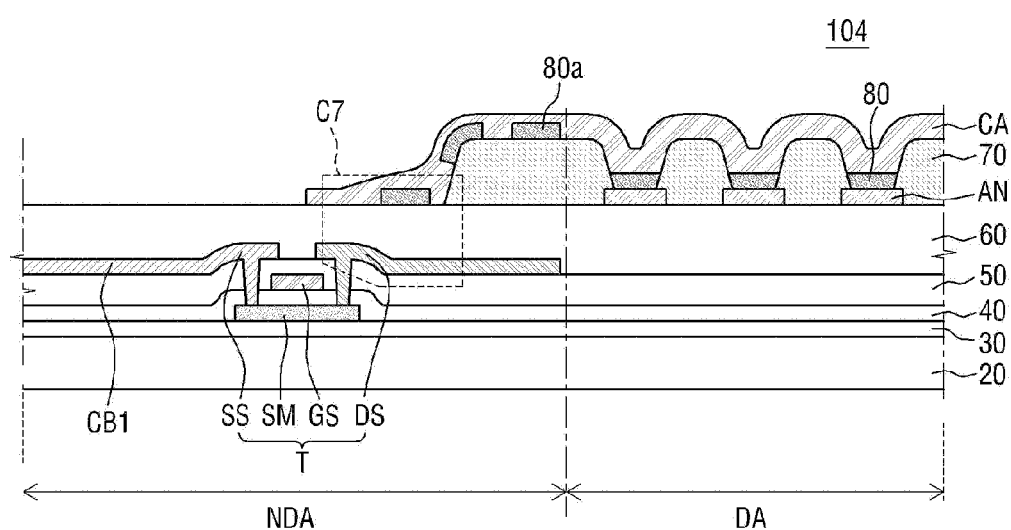
FIG. 13 is a cross-sectional view of the organic light-emitting display device shown in FIG. 12.

Another exemplary embodiment of the invention will hereinafter be described with reference to FIGS. 12 and 13. FIG. 12 is a diagram illustrating an organic light-emitting display device 104 according to another exemplary embodiment of the invention. FIG. 13 is a cross-sectional view of the organic light-emitting display device 104 shown in FIG. 12.

Referring to FIG. 12, capacitors (C7, C8) may be directly connected to a cathode CA of the organic light-emitting display device 104, and switching elements (SW7, SW8) may be connected between the capacitors (C7, C8) and power bus lines (CB1, CB2), respectively. Even when the capacitors (C7, C8) are directly connected to the cathode CA and the switching elements (SW7, SW8) are connected between the capacitors (C7, C8) and the power bus lines (CB1, CB2), since voltages are applied to the cathode CA via the capacitors (C7, C8), it is possible to effectively prevent an electric current having DC components from flowing through the cathode CA, thereby effectively preventing a voltage drop caused by resistance of the cathode CA.

Referring to FIG. 13, the cathode CA and a drain electrode DS may be separated from each other. The cathode CA and the drain electrode DS may be insulated from each other by a planarization layer 60. The cathode CA and the drain electrode DS may overlap each other and form a seventh capacitor C7.

A source electrode SS may be directly connected to a first power bus line CB1. According to some exemplary embodiments, the source electrode SS may be integrally formed with the first power bus line CB1.

Exemplary embodiments of the invention provide at least one of the following advantages.

That is, it is possible to reduce a voltage drop of power supplied to a cathode.

In addition, display quality of an organic light-emitting display device can be improved.

However, the effects of the invention are not restricted to the one set forth herein. The above and other effects of the invention will become more apparent to one of ordinary skill in the art to which the invention pertains by referencing the claims.

What is claimed is:

1. An organic light-emitting display device comprising:
   a plurality of organic light-emitting diodes which are arranged in a matrix, wherein a first row of the matrix shares a first cathode as a cathode and a second row of the matrix shares a second cathode as a cathode;
   a first switching element which is connected to the first cathode;
   a second switching element which is connected to the second cathode;
   a first capacitor which comprises a first electrode connected to the first switching element;
   a second capacitor which comprises a first electrode connected to the second switching element; and
   a power bus line which is connected to a second electrode of the first capacitor and a second electrode of the second capacitor,
   wherein the first switching element controls a connection between the first cathode and the first electrode of the first capacitor, and the second switching element controls a connection between the second cathode and the first electrode of the second capacitor.

2. The organic light-emitting display device of claim 1, wherein
   the organic light-emitting display device is divided into a display area in which the plurality of organic light-emitting diodes are disposed, and a non-display area which surrounds the display area,
   the power bus line comprises a first bus line which is disposed outside and adjacent to a first side of the display area and a second bus line which is disposed outside and adjacent to a second side of the display area which is opposite to the first side,
   the first switching element is connected to the first cathode in a first region adjacent to the first side of the display area,
   the second switching element is connected to the second cathode in the first region adjacent to the first side of the display area, and
   the first capacitor and the second capacitor are connected to the first bus line.

3. The organic light-emitting display device of claim 2, further comprising:
   a third switching element which is connected to the first cathode in a second region adjacent to the second side of the display area;
   a fourth switching element which is connected to the second cathode in the second region adjacent to the second side of the display area;
   a third capacitor which comprises a first electrode connected to the third switching element and a second electrode connected to the second bus line; and
   a fourth capacitor which comprises a first electrode connected to the fourth switching element and a second electrode connected to the second bus line.

4. The organic light-emitting display device of claim 1, wherein the first and second switching elements comprise thin-film transistors.

5. The organic light-emitting display device of claim 1, wherein the first and second switching elements are turned on simultaneously.

6. An organic light-emitting display device comprising:
- a plurality of anodes;
- an organic layer which is disposed on each of the plurality of anodes;
- a cathode which is disposed on the organic layer;
- a plurality of thin-film transistors, each comprising a drain electrode connected to the cathode; and
- a power bus line which is insulated from a source electrode of each of the plurality of thin-film transistors and overlaps the source electrode of each of the plurality of thin-film transistors to form a capacitor,
- wherein the power bus line is disposed above the source electrode of each of plurality of thin-film transistors.

* * * * *